United States Patent
Hoekstra et al.

(10) Patent No.: US 9,820,025 B2
(45) Date of Patent: Nov. 14, 2017

(54) MEMS DEVICE AND PROCESS

(71) Applicant: Cirrus Logic International (U.K.) Ltd, Edinborough (GB)

(72) Inventors: Tsjerk Hoekstra, Balerno (GB); Colin Robert Jenkins, Livingston (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 14/430,438

(22) PCT Filed: Sep. 19, 2013

(86) PCT No.: PCT/GB2013/052459
§ 371 (c)(1),
(2) Date: Mar. 23, 2015

(87) PCT Pub. No.: WO2014/045041
PCT Pub. Date: Mar. 27, 2014

(65) Prior Publication Data
US 2015/0256915 A1   Sep. 10, 2015

Related U.S. Application Data

(60) Provisional application No. 61/704,876, filed on Sep. 24, 2012.

(30) Foreign Application Priority Data

Sep. 24, 2012   (GB) .................................. 1217010.6

(51) Int. Cl.
*H04R 1/08* (2006.01)
*B81B 3/00* (2006.01)
(Continued)

(52) U.S. Cl.
CPC ............. *H04R 1/08* (2013.01); *B81B 3/0021* (2013.01); *B81C 1/00158* (2013.01);
(Continued)

(58) Field of Classification Search
CPC ....................................................... H04R 1/08
See application file for complete search history.

(56) References Cited

U.S. PATENT DOCUMENTS

2009/0014819 A1   1/2009   Loeffler et al.

FOREIGN PATENT DOCUMENTS

DE   10 2005 035058 A1   2/2007
EP                2505548 A2   10/2012
(Continued)

OTHER PUBLICATIONS

International Search Report and Written Opinion, International Patent Application No. PCT/GB2013/052459, mailed Dec. 12, 2013, 10 pages.

(Continued)

*Primary Examiner* — Alexander Ghyka
(74) *Attorney, Agent, or Firm* — Jackson Walker L.L.P.

(57) ABSTRACT

This application relates to MEMS devices, especially MEMS capacitive transducers and to processes for forming such MEMS transducer that provide increased robustness and resilience to acoustic shock. The application describes a MEMS transducer (400) having at least one membrane layer (101) supported so as to define a flexible membrane. A strengthening layer (401; 701) is mechanically coupled to the membrane layer and is disposed around the majority of a peripheral area of the flexible membrane but does not extend over the whole flexible membrane. The strengthening layer, which in some embodiments may be formed from the same material as the membrane electrode (102) being disposed in the peripheral area helps reduce stress in membrane at locations that otherwise may be highly stressed in acoustic shock situations. The membrane may be supported over a substrate cavity and the strengthening layer may be provided (Continued)

in an area of the membrane that could make contact with the edge (202) of the substrate cavity.

19 Claims, 6 Drawing Sheets

(51) Int. Cl.
*H04R 19/00* (2006.01)
*B81C 1/00* (2006.01)

(52) U.S. Cl.
CPC .... *H04R 19/005* (2013.01); *B81B 2201/0257* (2013.01); *H04R 2201/003* (2013.01)

(56) References Cited

FOREIGN PATENT DOCUMENTS

JP          2006 121465 A      5/2006
WO            03076878 A1      9/2003

OTHER PUBLICATIONS

Search Report under Section 17 and Combined Search and Examination Report under Section 17 & 18(3), GB Patent Application No. GB1217010.6, dated Dec. 13, 2012, 2 pages.

United States Patent US 9,820,025 B2

MEMS DEVICE AND PROCESS

FIELD OF DISCLOSURE

This invention relates to a micro-electro-mechanical system (MEMS) device and process, and in particular to a MEMS device and process relating to a transducer, for example a capacitive microphone.

BACKGROUND

Various MEMS devices are becoming increasingly popular. MEMS transducers, and especially MEMS capacitive microphones, are increasingly being used in portable electronic devices such as mobile telephones and portable computing devices.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between the electrodes. In the case of output transducers, the membrane is moved by electrostatic forces generated by varying a potential difference applied across the electrodes.

FIGS. 1a and 1b show a cross section and a cut-away perspective view, respectively, of known capacitive MEMS microphone devices 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

The first cavity 109 may be formed using a first sacrificial layer during the fabrication process, i.e. using a material to define the first cavity which can subsequently be removed, and depositing the membrane layer 101 over the first sacrificial material.

Formation of the first cavity 109 using a sacrificial layer means that subsequent etching of the substrate cavity 108 does not play any part in defining the diameter of the membrane. Instead, the diameter of the membrane is defined by the diameter of the first cavity 109 (which in turn is defined by the diameter of the first sacrificial layer) in combination with the diameter of the second cavity 110 (which in turn may be defined by the diameter of a second sacrificial layer). The diameter of the first cavity 109 formed using the first sacrificial layer can be controlled more accurately than the diameter of a back-etch process performed using a wet-etch or a dry-etch. Etching the substrate cavity 108 will therefore define an opening in the surface of the substrate underlying the membrane 101.

A plurality of holes, hereinafter referred to as bleed holes 111, connect the first cavity 109 and the second cavity 110.

As mentioned the membrane may be formed by depositing at least one membrane layer 101 over a first sacrificial material. In this way the material of the membrane layer(s) may extend into the supporting structure, i.e. the side walls, supporting the membrane. The membrane and back-plate layer may be formed from substantially the same material as one another, for instance both the membrane and back-plate may be formed by depositing silicon nitride layers. The membrane layer may be dimensioned to have the required flexibility whereas the back-plate may be deposited to be a thicker and therefore more rigid structure. Additionally various other material layers could be used in forming the back-plate 104 to control the properties thereof. The use of a silicon nitride material system is advantageous in many ways, although other materials may be used, for instance MEMS transducers using polysilicon membranes are known.

In some applications, the microphone may be arranged in use such that incident sound is received via the back-plate. In such embodiments a further plurality of holes, hereinafter referred to as acoustic holes 112, are arranged in the back-plate 104 so as to allow free movement of air molecules, such that the sound waves can enter the second cavity 110. The first and second cavities 109 and 110 in association with the substrate 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of holes to allow air to freely move between the second cavity and a further volume above the back-plate.

In other applications the microphone may be arranged such that, some sound components may be received via the substrate cavity 108 and other sound components may be received via the back-plate 104.

In use, in response to a sound wave corresponding to a pressure wave incident on the microphone, the membrane is deformed slightly from its equilibrium position. The distance between the lower electrode 102 and the upper electrode 103 is correspondingly altered, giving rise to a change in capacitance between the two electrodes that is subsequently detected by electronic circuitry (not shown). The bleed holes allow the pressure in the first and second cavities to equalise over a relatively long timescales (in acoustic frequency terms) which reduces the effect of low frequency pressure variations, e.g. arising from temperature variations and the like, but without impacting on sensitivity at the desired acoustic frequencies.

The transducer shown in FIG. 1 is illustrated with substantially vertical side walls supporting the membrane layer 101 in spaced relation from the back-plate 104. Given the nature of the deposition process this can lead to a high stress concentration at the corners formed in the material layer that forms the membrane. Sloped or slanted side walls may be used to reduce the stress concentration. Additionally or alternatively it is known to include a number of support structures such as columns to help support the membrane in a way which reduces stress concentration as illustrated in FIGS. 2a, 2b and 2c. FIG. 2a shows a transducer 200 in plan view, but omitting the uppermost part of the back-plate layer 104 for clarity. FIGS. 2b and 2c illustrate the periphery of a MEMS microphone structure (along the line A-A' shown in FIG. 2a) in perspective and cross sectional views respectively, where similar components are identified by the same numerals as used in FIG. 1.

In this example the MEMS device 200 is formed with a plurality of support structures 201, which in this example are formed as supporting columns, arranged around the periphery of the membrane. The columns are formed by patterning the first sacrificial material used to define the first cavity 109 such that the substrate 105 is exposed in a number of areas before depositing the material forming the membrane layer 101 (FIG. 2b shows one membrane layer being deposited directly on the substrate but it will be appreciated that that there may be various intermediate layers on the substrate and the membrane may be formed by depositing multiple membrane layers). Likewise the second sacrificial material used to define the second cavity 110 is patterned so that membrane layer 101 is exposed in the same areas prior to depositing the material of the back-plate layer. This results in a plurality of columns being formed around the periphery of the membrane, as shown in FIG. 2a, which provide support to the membrane but with a reduced stress concentration compared to the arrangement shown in FIG. 1. The columns are preferably formed with a stepped profile and/or slanted side walls to minimise stress. This process can lead to dimples in the upper surface of the back-plate layer in the area of the columns.

FIG. 2a also shows that a conductive track 204 extends from the membrane electrode 102 across the membrane to a contact point outside the suspended portion of the membrane for electrical connection to a buffer amplifier or other circuitry either co-integrated on the same substrate or via pads and wire-bond or flip-chip connections to circuitry on other substrates in the same or another package.

MEMS transducers such as those shown in FIGS. 1 and 2 may usefully be used in a range of devices, including portable devices. Especially when used for portable devices it is desirable that the MEMS transducers are sufficiently rugged to survive expected handling and use of the device. There is therefore a general desire to improve the resilience of MEMS devices.

SUMMARY

The present invention is therefore concerned with improving the robustness and/or resilience of MEMS devices.

Thus according to an aspect of the present invention there is provided a MEMS transducer comprising:
- at least one membrane layer supported so as to define a flexible membrane; and
- a strengthening layer mechanically coupled to said membrane layer;
- wherein the strengthening layer is disposed around the majority of a peripheral area of the flexible membrane but does not extend over the whole flexible membrane.

The strengthening layer may extend radially from a support structure supporting the membrane layer onto a flexible part of the membrane layer and may form part of a side wall of the support structure. The support structure may comprise a supporting column structure.

The membrane layer may be supported relative to a first surface of a substrate, the substrate having at least one substrate cavity therein defining an area of opening in the first surface of the substrate, wherein the perimeter of said area of opening is at least partly within an area underlying said flexible membrane. In such case the strengthening layer may be disposed such that the perimeter of the area of opening at least partly underlies the peripheral area of flexible membrane having the strengthening layer. The strengthening layer may be disposed on the membrane layer in an area of the membrane which may make contact with the perimeter of the opening area if sufficiently deflected. The strengthening layer may be continuous in a radial direction from within a support structure supporting the membrane layer to a point inward on the flexible membrane beyond the perimeter of said opening area.

The strengthening layer may be disposed around 75% or more of the perimeter of the membrane or around substantially the entire perimeter of the membrane.

Radially inside the strengthening layer may be a circumferential area of flexible membrane, the majority of which is free of the material of the strengthening layer. Around a majority of the perimeter of the flexible membrane, there may be a region radially inside the strengthening layer which is free of the material of the strengthening layer.

The strengthening layer may comprises a layer of material which has a greater elasticity, a greater plasticity and/or a greater ductility than the material of the membrane layer and/or which is in greater tensile stress than the material of the membrane layer.

The strengthening layer may comprise a layer comprising at least one of the group of: titanium, aluminium, copper and gold or an alloy thereof.

The strengthening layer may comprise a plurality of layers of different materials having different materials characteristics. Said material characteristics may comprise at least one of: elasticity, plasticity, ductility, tensile stress, yield stress and Young's modulus.

A first strengthening layer may be coupled to the membrane layer in said peripheral area and the transducer further comprises a second strengthening layer having a different geometry on the membrane layer to the first strengthening layer.

The thickness of the strengthening layer may be between about 30 and 100 nm inclusive.

The membrane structure may comprise a membrane electrode and the strengthening layer may be formed from the same material as the membrane electrode. The material forming the membrane electrode may be discrete from the strengthening layer disposed in the peripheral area of the membrane. A first area of first material may be disposed so as to form the membrane electrode and a second area of first material disposed to form said strengthening layer wherein said second area substantially surrounds said first area. Between the first and second areas there may be a third area which is mainly devoid of any first material.

The strengthening layer may be disposed on the opposite side of the membrane layer to a substrate. The transducer may also comprise a back-plate structure wherein the membrane layer is supported to be flexible with respect to said back-plate structure.

The transducer may be a capacitive sensor such as a microphone. The transducer may comprise readout circuitry. The transducer may be located within a package having a sound port. The transducer may be implemented in an electronic device which may be at least one of: a portable device; a battery powered device; an audio device; a computing device; a communications device; a personal media player; a mobile telephone; a games device; and a voice controlled device.

In a further aspect the invention provides a method of fabricating a MEMS transducer having a flexible membrane, the method comprising:
forming a membrane layer to form at least part of said flexible membrane; and
forming a strengthening layer mechanically coupled to an area of said membrane layer that corresponds to a peripheral area of the flexible membrane;
wherein the strengthening layer does not extend over the whole of the flexible membrane.

The method may be used to form transducer according to any of the embodiments discussed above. In particular the strengthening layer may extend radially from an area on the membrane layer that corresponds to the membrane support onto an area that corresponds to the flexible part of the membrane. The method may involve forming at least one side wall structure to support the flexible membrane wherein part of the strengthening layer forms part of the at least one side wall structure. The method may involve forming the membrane layer so as to be suspended over a first surface of a substrate and forming at least one cavity in the substrate to define an area of opening in the first surface of the substrate, wherein the perimeter of the opening area underlies the area of strengthening layer.

Forming the strengthening layer may comprise depositing a layer of first material onto the membrane layer and patterning the layer of first material to form the strengthening layer. The method may also involve forming a patterned layer of first sacrificial material on a substrate; forming the membrane layer over the first sacrificial material and the substrate; and forming the strengthening layer on the membrane layer in an area corresponding to the peripheral area of the first sacrificial material and area where the membrane layer contacts the substrate.

The method may involve forming a membrane electrode mechanically coupled to the membrane layer, wherein the material of the strengthening layer is the same material as the membrane electrode. Forming the strengthening layer may involve forming a layer of first material on the membrane layer and patterning the layer of first material to form the membrane electrode and the strengthening layer.

In a further aspect the invention provides a MEMS transducer comprising:
a flexible membrane suspended over a first surface of a substrate,
the substrate having one or more substrate cavities, the one or more substrate cavities defining an opening area in the first surface;
wherein a peripheral area of the suspended membrane carries a strengthening layer, the strengthening layer overlying the perimeter of the opening area; and
a non-peripheral area of the surface of the membrane is devoid of the material of the strengthening layer.

In a yet further aspect there is provided a MEMS transducer comprising:
a membrane structure comprising:
a flexible membrane;
a first area of first material disposed so as to form a membrane electrode; and
a second area of first material disposed to form a strengthening layer for said flexible membrane;
wherein the second area substantially surrounds the first area and between the first and second areas there is a third area, the majority of which is devoid of any first material.

BRIEF DESCRIPTION OF THE DRAWINGS

The invention will now be described by way of example only, with reference to the accompanying drawings, of which.

DETAILED DESCRIPTION

Figure 1A:
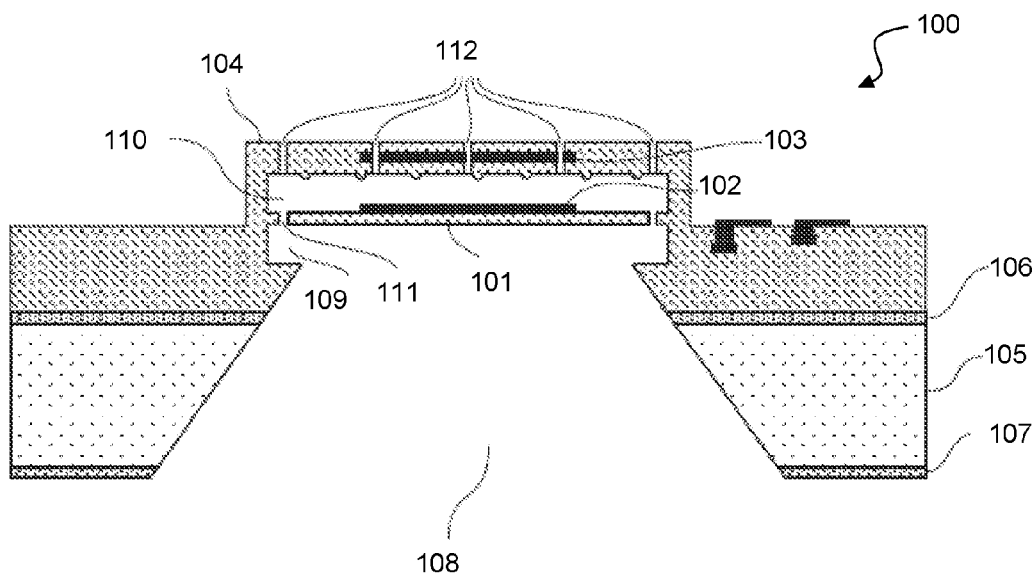
FIGS. 1a and 1b illustrate known capacitive MEMS transducers in section and cut-away perspective views.
Figure 1B:
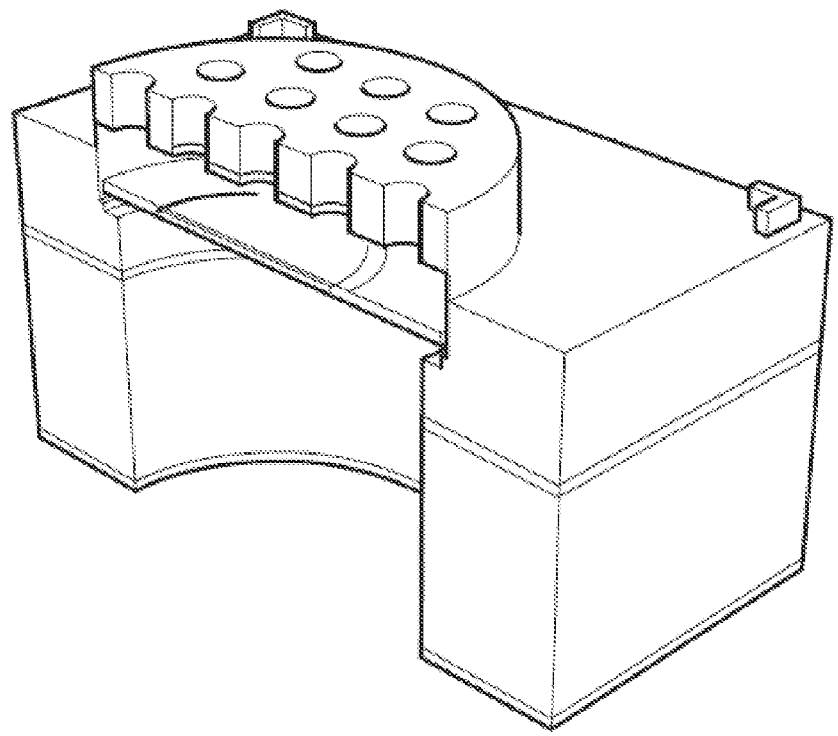

As described above MEMS transducers such as shown in FIGS. 1 and 2 may be usefully employed in a variety of different devices and increasingly are becoming popular for use in portable electronic devices such as mobile telephones, mobile computing devices and/or personal media players and the like.

To be useful for use in portable electronic devices such transducers should be able to survive the expected handling and use of the portable device, which may include the device being accidentally dropped.

If a device such as a mobile telephone is subject to a fall, this can result not only in a mechanical shock due to impact but also a high pressure impulse incident on a MEMS transducer. For example, a mobile telephone may have a sound port for a MEMS microphone on one face of the device. If the device falls onto that face, some air may be compressed by the falling device and forced into the sound port. This may result in a high pressure impulse incident on the transducer. It has been found that in conventional MEMS transducers of the form described above high pressure impulses can potentially lead to damage of the transducer.

Figure 2A:
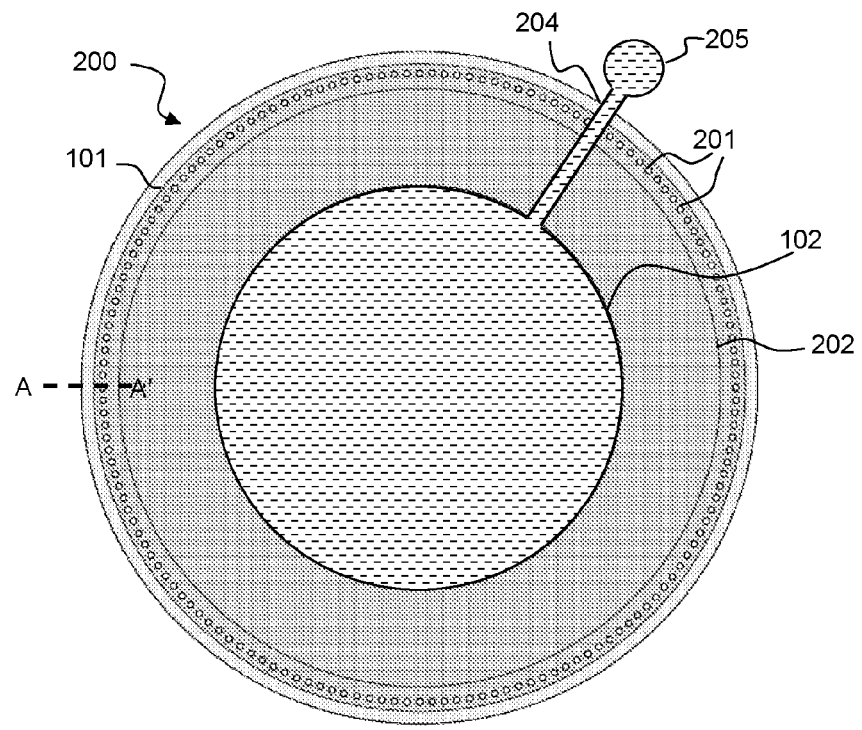
FIGS. 2a, 2b and 2c illustrate plan, sectional and perspective views of another known capacitive MEMS transducer.
Figure 2B:
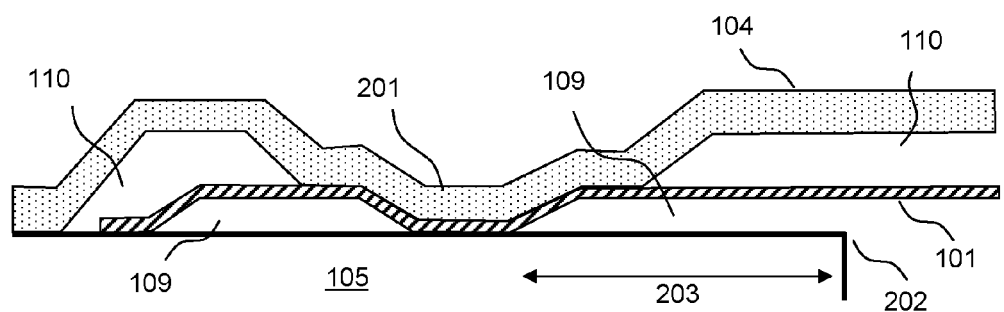
Figure 2C:
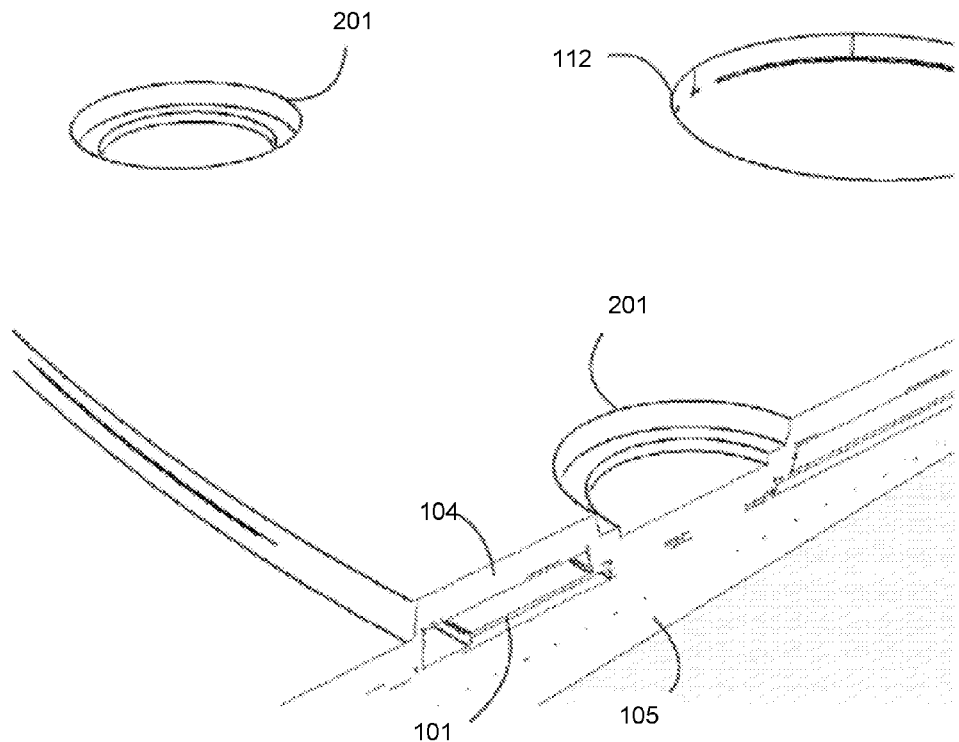

Referring again FIGS. 2a-2c, as previously described, a MEMS transducer 200 may have a membrane layer 101 and a back-plate layer 104 formed so that a membrane is suspended above a surface of a substrate 105 to define a first cavity 109 and the back-plate 104 is suspended above the membrane to form a second cavity 110. Note as used herein the term substrate will be used to refer to the one or more layers of material above which the membrane is suspended. This may typically comprise a silicon wafer and may also include one or more deposited layers, possibly including layers of the same material used to form the membrane layer.

As mentioned above a sacrificial material may be used to define the dimensions of the first cavity and hence the dimensions of the membrane. As discussed sacrificial material may be deposited and patterned relatively accurately to provide good control over the membrane dimensions. A substrate cavity is also provided in the substrate 105, typically by means of a back etch. To ensure that it is the dimensions of the first cavity 109 which determine the membrane dimensions, the substrate cavity is arranged to have a smaller diameter than the first cavity at the point 202 where the substrate cavity and first cavity meet, in other words the opening of the substrate cavity at the surface of the substrate has a smaller diameter than the first cavity. This means that in such a structure the membrane is suspended above a section of the substrate, indicated by arrow 203, before reaching the opening of the substrate cavity, i.e. the opening of the substrate cavity 108 in the surface of the substrate is within the area of the flexible membrane.

The sacrificial material used to define the first and second cavities is dimensioned so as to provide a desired equilibrium separation between the membrane layer 101 and the substrate 105 and also between the membrane layer 101 and the back-plate 104 so as to provide good sensitivity and dynamic range in use. In normal operation the membrane may deform within the volume defined by the first and second cavities without contacting the back-plate and/or substrate 105.

Figure 3A:
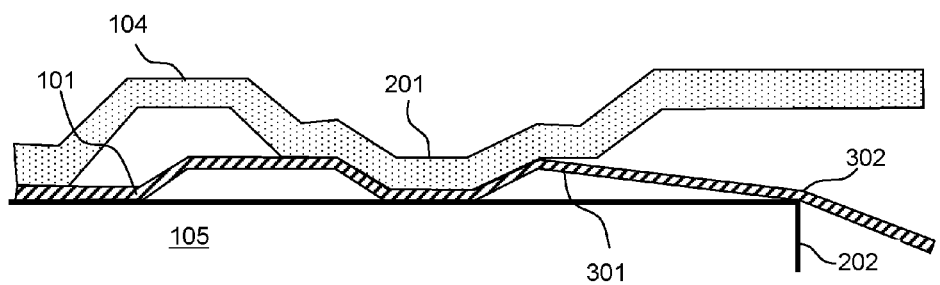
FIGS. 3a and 3b illustrate how a high pressure event may affect the membrane.
Figure 3B:
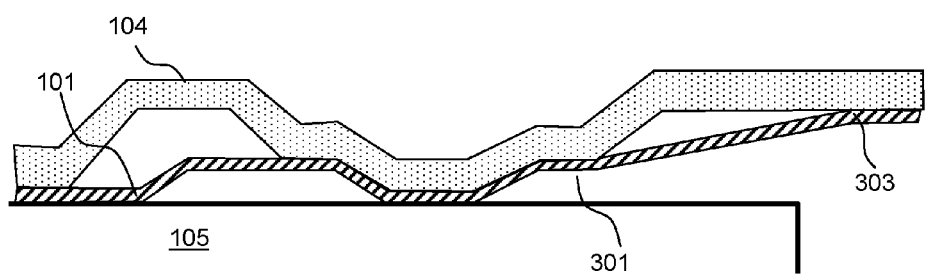

In response to a high pressure impulse however the membrane layer 101 may exhibit a greater amount of deformation than usual. FIG. 3a illustrates the situation where the membrane has been deformed downwards following a high pressure event and FIG. 3b shows the situation where the membrane has been displaced upwards.

Consider the situation where the microphone is arranged to receive incident sound from a sound port arranged above the back-plate 104 and the sound port pressure suddenly increases, for instance as a result of air trapped when the device falls being forced into the sound port. This may result the pressure in the second cavity 110 being significantly greater than the pressure in the first cavity 109, displacing the membrane downwards to greater extent than is usual. This may result in a relatively large stress at point 301 where membrane layer 101 forms part of the sidewall of supporting structure 201 and, in some instances, delamination of the membrane layer from the rest of the sidewall structure. Further, if the pressure difference is great enough the membrane may make contact with the substrate 105 at the edge of the substrate defined by the side wall 202 of the opening of substrate cavity 108. Typically the edge of the substrate at the location of the opening of the substrate cavity has a relatively sharp angle and thus the membrane may be deformed round this edge, leading to a large stress concentration at this point 302.

As mentioned previously the membrane layer 101 will typically be formed from one or more thin layers of semiconductor material, such as silicon nitride. Whilst such a material can be flexible when subject to even stresses, if there is a significant localised out-of-plane stress such as may be introduced into the membrane at point 302 by contact with the edge of the opening of the substrate cavity 108, the membrane material can be relatively brittle. Thus contact between the membrane and the edge of the opening of the substrate cavity in this way can lead to damage such as cracking of the membrane.

As the high pressure caused by trapped air may persist for a relatively long time, the pressure in the first and second cavities may equalise by virtue of the bleed holes (not shown in FIG. 2 or 3) discussed above with relation to FIG. 1. Thus the pressure in the first cavity, and substrate cavity, may increase until the pressures are equalized. However once air is no longer being forced into the sound port the pressure in the sound port will reduce quite quickly and, as typically the back-plate has a low acoustic impedance, the pressure in the second cavity will quickly reduce. At this point the pressure in the first cavity may be significantly greater than the pressure in the second cavity and thus the membrane may be deformed upwards, again to a greater extent than may usually be the case. Again this may lead to a significant stress in region 301 where the membrane layer 101 meets the sidewall of the supporting structure. If the pressure difference is large enough the membrane may be displaced far enough to contact the back-plate 104. This may limit the amount of travel of the membrane as compared with the situation shown in FIG. 3a but again this may introduce stress into the membrane layer at the point 303 where it contacts the back-plate 104.

It should be appreciated that both of these situations can also occur when sound is received via the substrate cavity 108 but in the opposite order. Whilst both situations may lead to damage of the membrane it is believed that the situation shown in FIG. 3a is more likely to lead to damage.

To reduce the likelihood of damage in such high pressure situations embodiments of the present invention provide MEMS transducers having at least one membrane layer supported so as to define a flexible membrane and a strengthening layer mechanically coupled to the membrane layer. The strengthening layer is disposed around the majority of a peripheral area of the flexible membrane but does not extend over the whole flexible membrane.

The use of a strengthening layer mechanically coupled to peripheral area of the membrane layer helps avoid damage to the membrane. The strengthening layer will act to reinforce the peripheral area of the membrane and can aid in stiffening the membrane at this point. The strengthening layer also helps distribute any stress in the membrane layer. The strengthening layer can thus ensure that the peak stress experienced by the membrane in the peripheral area for a given acoustic overload is reduced and is thus less likely to exceed the yield stress of the membrane in this area, with thus less likelihood of damage.

The strengthening layer may be coupled to the membrane layer in any convenient arrangement, i.e. it may be disposed on top of, or underneath, a membrane layer, or sandwiched between two membrane layers. There may be a plurality of strengthening layers, some or all disposed on top of each other in some areas of a membrane.

The strengthening layer is disposed around a peripheral area of the membrane, i.e. towards the outer edge of the flexible membrane. Thus the strengthening layer is provided in the vicinity of at least some of the possible points of high stress identified above, i.e. those points of the membrane surface which may experience a high stress concentration when the membrane is subject to a large deformation. To ensure that the strengthening layer provides sufficient strengthening to the membrane the strengthening layer is provided around a majority of the periphery of the membrane. By majority is meant more than 50% of the perimeter of the membrane.

The strengthening layer is not provided over the whole of the membrane however, which thus means the strengthening layer does not have any significant negative impact on the performance of the transducer. For example disposing the strengthening layer over a large portion of a microphone membrane might adversely affect its flexibility, and hence reduce the acoustic sensitivity of the microphone. Embodiments of the present invention thus provide strengthening of the membrane in areas where it is advantageous, i.e. locations on the membrane that may be subject to particularly high stress in response to a large pressure difference acting on the membrane.

Figure 4A:
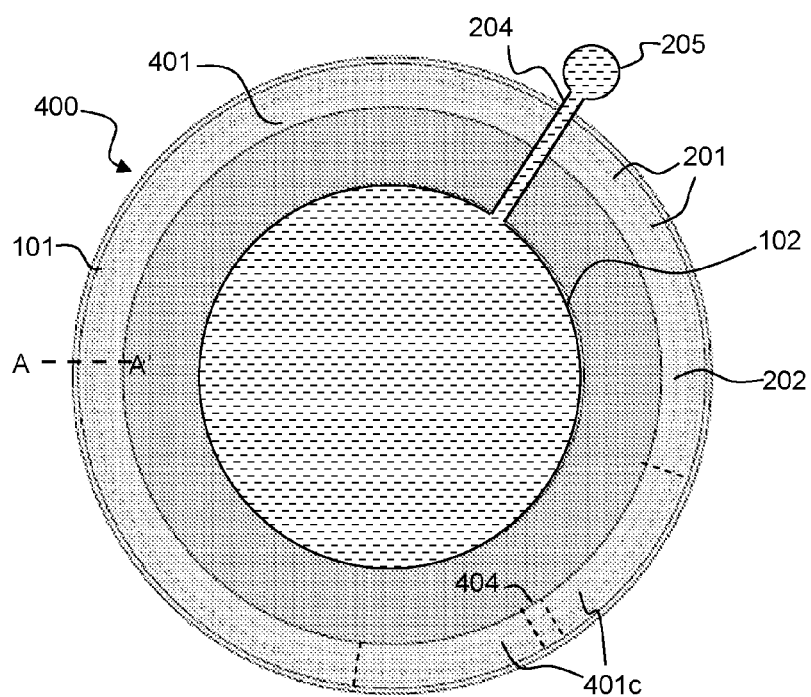
FIGS. 4a and 4b illustrate an embodiment of a MEMS transducer according to the present invention.
Figure 4B:
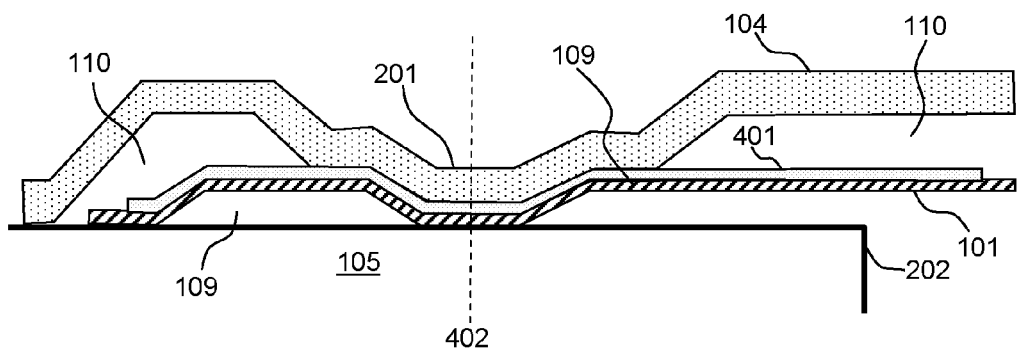

FIGS. 4a and 4b illustrates plan and section views of one embodiment of a MEMS transducer 400 according to an embodiment of the invention. The transducer 400 has a similar structure to that described above with reference to FIG. 2 and similar features are identified using the same reference numerals.

In the embodiment shown in FIG. 4 there is an strengthening layer 401 which is disposed on top of the membrane layer 101.

In this embodiment the strengthening layer is disposed on top of the membrane layer 101 as a continuous layer around the entire periphery of the membrane. The strengthening layer 401 is disposed on the part of the membrane layer 101 which forms part of the support columns 201 and extends inward on the flexible membrane beyond the edge 202 of the substrate cavity—or more particularly beyond the point at which the membrane layer 101 may make contact with the edge 202 of the opening of the substrate cavity in a high pressure situation. Thus the perimeter of the opening of the substrate cavity in the substrate surface underlies the strengthening layer. In other words the strengthening layer partly overhangs the substrate cavity.

The material of the strengthening layer advantageously has a greater elasticity than the material of the membrane layer and/or may be in greater tensile stress than the material of the membrane layer. Such a strengthening layer can help re-distribute the stress experienced by the membrane layer, especially in a membrane layer formed from material such as silicon nitride. The strengthening layer may additionally or alternatively comprise a material which has a greater plasticity than the material of the membrane layer, for example the strengthening layer may comprise a material with a greater ductility than the material of the membrane. The strengthening layer may thus help the membrane layer to flex without damage and can help reduce the stress within the membrane layer when subject to high pressures/large membrane deflection. The strengthening layer may also reduce the chance of catastrophic failure.

Figure 5:
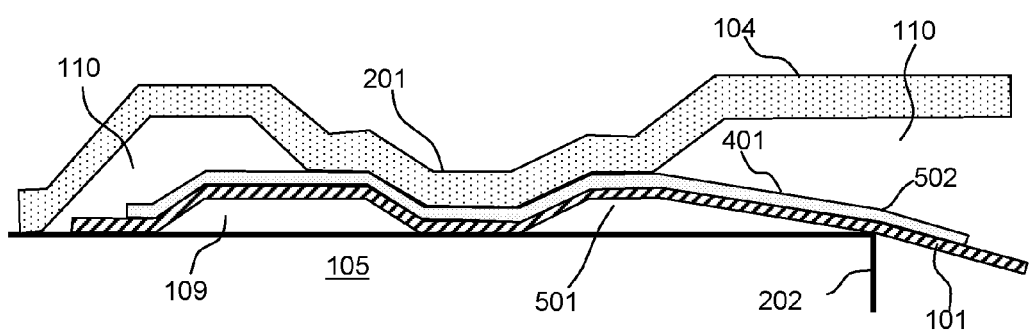
FIG. 5 illustrates the effect of a high pressure impulse on an embodiment of the present invention.

FIG. 5 illustrates a similar situation to that shown in FIG. 3a, where the membrane is deflected downwards by a relatively large pressure difference, to the extent that the membrane layer 101 contacts the substrate 105 at the edge 202 of the substrate cavity. In this instance however the presence of strengthening layer 401 at point 501 on the membrane layer, where the membrane layer becomes part of the side wall of the support structure 201, helps reduce the stress experienced by the membrane layer at this part. The stress can be distributed throughout the strengthening layer 401 and, as the strengthening layer 401 also extends into the side wall structure, the stress can also be distributed to the support structure 201.

The presence of strengthening layer 401 at point 502 on the membrane layer, where the membrane layer impacts on the edge 202 of the opening of the substrate cavity also helps strengthen the membrane layer and distribute stress at this point. This may reduce the amount of deflection of the membrane layer at this point in response to a larger than usual pressure difference acting on the membrane. The strengthening layer will also help provide resilience to mechanical shock.

The strengthening layer may also add resilience in the situation shown in FIG. 3b where the membrane is deflected so as to make contact with the back-plate. At a certain pressure level the middle of the membrane (or the membrane electrode) may just about make contact with the back-plate. At this point the stress in the membrane may be relatively evenly distributed—apart from at the periphery of the membrane as discussed earlier. Thus the strengthening layer may help distribute stress experienced at the edge of the membrane.

In the embodiment shown in FIGS. 4a and 4b the strengthening layer 401 is disposed to be continuous in a radial direction throughout the whole of the support structure and to extend inward on the membrane to a point beyond the limit of the opening of the substrate cavity, i.e. the first material will, in equilibrium position, overhang the opening of the substrate cavity. Conveniently the strengthening layer 401 overhangs the substrate cavity by a small amount, such that, as shown in FIG. 5, if the membrane is deflected to such an extent to contact the substrate, the point of contact corresponds to a location which is coupled to the strengthening layer. In some embodiments the strengthening layer may extend inward into the flexible membrane to a point further then the expected point of contact with the substrate cavity, for instance the strengthening layer may extend for of the order of 50 μm or so inwards past the likely point of contact. Extending the strengthening layer radially inward beyond the likely point of contact can provide advantageous in terms of bend radius of the membrane.

Having the strengthening layer extend continuously radially from within the support structure to overhang the substrate cavity (and thus be present at the point of possible contact between the membrane layer 101 and edge 202 of the substrate cavity) is particularly advantageous as it allows stress experienced at point 502 to be distributed within the support structure.

Figure 6:
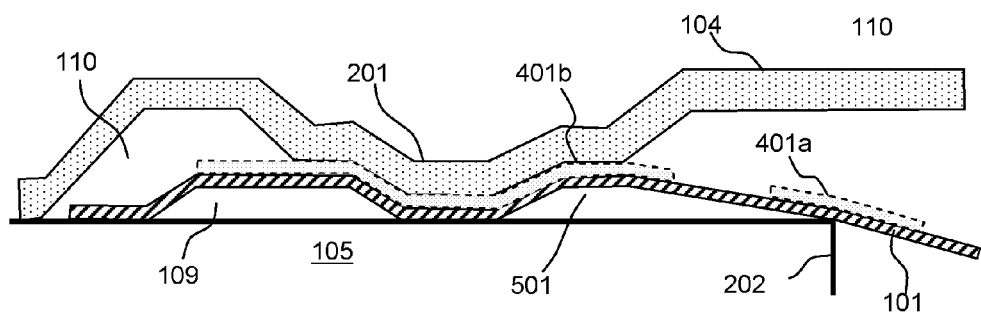
FIG. 6 illustrates a cross section of further embodiment of the present invention.

In some embodiments however it may be sufficient to dispose the strengthening layer at a first location of the membrane layer, where contact with another part of the transducer structure is possible, but where such strengthening layer does not extend as far as the support structure for the membrane. For example, as illustrated in FIG. 6 there may be a strengthening layer 401a disposed in the area of the membrane which may contact the edge 202 of the substrate cavity in response to a high pressure differential. This strengthening layer 401a does not extend as far as the support structure 201. It should be noted that this strengthening layer 401a is still disposed toward the outer part of the flexible membrane and thus is disposed around the periphery of the membrane.

As mentioned previously in embodiments such as shown in FIG. 4, where there is a substrate cavity defining an opening in the substrate that is within the area of the flexible membrane, a downward deflection of the membrane such that the membrane contacts the edge of the opening in the substrate surface may be a particular source of failure for conventional MEMS transducers. Providing strengthening layer 401a even just in this location may therefore offer significant improvements in the resilience and robustness of MEMS transducers. Thus embodiments of the present invention may relate to MEMS transducers comprising an opening in the surface of substrate for a substrate cavity that is within the area of the flexible membrane, wherein the membrane comprises a strengthening layer coupled to only part of the membrane in the location where the membrane may, in use, contact the edge of the opening.

Alternatively there may be a strengthening layer 401b which extends from within the side wall of a support structure inwards onto at least part of the flexible membrane but which may not extend as far as the substrate cavity (if present). In some embodiments there may be two discrete strengthening layers, i.e. strengthening layers 401a and 401b may be both present as discrete strengthening layers. In this instance the strengthening layers 401a and 401b may have the same material characteristics but in some embodiments different materials and/or different thicknesses could be used for the different strengthening layers.

It will be noted that the embodiment shown in FIG. 4 includes a membrane support in the form of pillars or columns as described above in relation to FIG. 2. The same principles apply to embodiments of MEMS transducers which simply have a continuous sidewall from which the membrane layer extends to form the flexible membrane, for example similar to sidewall arrangement shown in FIG. 1. For example in some embodiments the structure shown to the left of line 402 may not be present (in other words consider the structure to the right of line 402 being present at any cross-section through the edge of the transducer and not just in certain locations). It can clearly be seen that the same principles apply and the layer 402 may extend from within the continuous side wall inwards onto the membrane layer 101. It will also be clearly appreciated that the membrane support may take other forms, e.g. vertical side walls etc. In general however all such support structures will involve a membrane layer extending from some sort of side wall structure and the point at which the membrane layer emerges from the side wall may experience a greater stress than other parts of the membrane when a large pressure differential causes a large deflection of the membrane. Thus one aspect of embodiments of the present invention is the use of a strengthening layer which is coupled to a membrane layer so that the strengthening layer extends from within a side wall structure to a flexible part of the membrane—but which is not disposed over the entire membrane.

Referring back to FIG. 4a the strengthening layer 401 may be continuous around the entire periphery of the membrane. As shown this may result in a strengthening layer which, for a generally circular membrane, has an annular shape (for membranes of different shapes the layer 401 may generally correspond to the shape of the perimeter of the membrane).

In some embodiments however the strengthening layer may be divided into one or more sections around the periphery of the periphery of the membrane, for instance there may be a plurality of sections 401c separated by relatively small gaps as indicated by the dotted lines.

As discussed above the strengthening layer is provided around the majority of the periphery of the membrane, i.e. more than 50% of the perimeter. Advantageously the strengthening layer 401 may extend for more than 50% of the perimeter of the membrane. In some embodiments the strengthening layer may be provided around 75% or more of the perimeter of the membrane and possible around at least 90% of the perimeter of the membrane or substantially the entire perimeter of the membrane. Conveniently, if the strengthening layer is divided into different sections these may be relatively evenly spread around the perimeter of the membrane so as to provide strengthening evenly around the whole membrane.

In the embodiment shown in FIG. 4a the material of the conductive track 204 for connecting the membrane electrode 102 to the contact pad 205 on the substrate is formed on top of the strengthening layer 401. As one skilled in the art will appreciate this will result from the strengthening layer 401 being formed prior to deposition and patterning of the material of the conductive track 204—which usually is a metal material and is usually part of the same material used to form the electrode 102. Depositing the strengthening layer 401 prior to forming the conductive track ensures that the strengthening layer contacts the membrane layer even in the vicinity of the conductive track. In other embodiments however the material forming the strengthening layer may be deposited after the material used to form the conductive track 204 and thus may be deposited on top of conductive track 204.

It will be seen that the strengthening layer 401 is only provided in the peripheral area of the flexible membrane, extending from the support structure to overhang the opening of the substrate cavity. The strengthening layer is not provided over the whole of the membrane layer and thus has a limited impact on transducer performance. The strengthening layer is thus disposed such that radially inside the strengthening layer is a circumferential area of flexible membrane, the majority of which is free of the material of the strengthening layer. In other words, around a majority of the perimeter of the flexible membrane, there is a region radially inside the strengthening layer which is free of the material of the strengthening layer. The strengthening layer is thus provided in an outer peripheral region of the membrane and a substantial area within the membrane is devoid of any strengthening layer.

The material(s) used to form the strengthening layer may be compatible with standard device fabrication processes and thus may advantageously be material(s) compatible with standard CMOS processing. As mentioned the material of the strengthening layer may be chosen to have a greater plasticity, e.g. ductility, than the material of the membrane layer and/or be in greater tensile stress. Suitable materials include various CMOS compatible metals such as titanium, aluminium, copper and gold as well as alloys of such materials, e.g. such as aluminium nitride. The strengthening layer may comprise layers of one or more of these metals, e.g. for assisting adhesion to other structural layers. The strengthening layer may comprise a plurality of layers of different material, for example layers with different material characteristics. The different layers may comprise materials with deliberately different physical properties such as elasticity, plasticity, ductility, tensile stress, Young's modulus, and/or fracture stress point to attempt to optimise the properties of the resulting laminate sandwich to provide better ruggedness.

In some embodiments, there may be more than one strengthening layer provided at a given point on the membrane layer, i.e. there may be a layer of first material and also a layer of second material in the same location, the layers of first and second material together providing strengthening to the membrane layer. The first and second strengthening layers may be coterminous or there may be some areas where there is only first or second material. In other words there may be first and second strengthening layers having different geometries, i.e. having different patterns on the membrane layer.

The strengthening layer may be relatively thin. For instance, when using a metal as the strengthening layer a thickness of around 30-100 nm, for example about 60 nm may be sufficient. With a MEMS transducer using silicon nitride as the membrane layer the membrane layer may have a thickness of around 0.4 µm. In such an embodiment a metal strengthening layer of the order of 60 nm thick may be disposed as shown in FIG. 4b to provide increased robustness of the transducer with no significant detrimental impact on performance.

It may be possible in some fabrication processes to use thinner metal layers, for instance of the order of 30-40 nm or less. However in some fabrication processes the deposition process may not reliably result in a continuous metal layer at such relatively low thicknesses, possibly producing discrete islands of metal—reducing the effectiveness of the strengthening layer.

Conveniently the strengthening layer 401 may have a relatively uniform layer thickness, at least in the part disposed on the flexible membrane, such that a single deposition step may be used for the material of the strengthening layer. However in some embodiments it may be beneficial for different parts of the strengthening layer 401 to have different thicknesses.

In one embodiment the material used to form the strengthening layer may conveniently be the same material as used to form the membrane electrode. In this embodiment the strengthening layer may be formed using the same general process steps as used to create the membrane electrode. In this embodiment no additional process steps may be required compared with the conventional fabrication process but the step of patterning the metal layer used to form the membrane electrode additionally comprises patterning the metal layer to form the strengthening layer as illustrated in FIG. 7.

Figure 7:
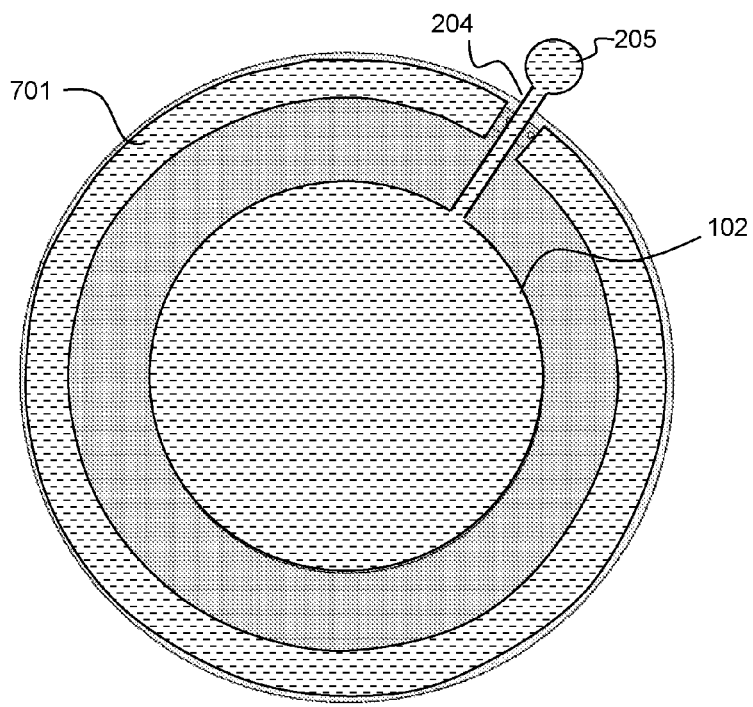
FIG. 7 illustrates a plan view of a yet further aspect of the invention.

FIG. 7 shows a plan view of a transducer (omitting the back-plate for clarity) which shows membrane electrode 102—together with conductive track 204, formed on the electrode as described previously. In this embodiment however the metal used to form the electrode 102 has also been patterned to form strengthening layer 701 around substantially the whole of the periphery of the membrane as discussed above.

In the embodiment shown in FIG. 7 the metal layer is patterned so that the material of strengthening layer 701 is discrete from the electrode 102 and conductive track 204, in other words the strengthening layer 701 is substantially isolated from the conductive track 204. However this is not essential and in other embodiments the material could be continuous to form conductive track 204 and the material of the strengthening layer 701. As the strengthening layer 701 is only provided around the periphery of the membrane it would not significantly impact on device performance.

It will of course be appreciated that the strengthening metal layer 701 will form part of the column support structures. This detail is omitted from FIG. 7 for clarity.

In the embodiment shown in FIG. 7 the material that forms the strengthening layer 701 thus also forms the membrane electrode and thus some parts of the membrane within the outer peripheral area are also provided with the same material as the membrane layer (i.e. electrode area 102). However it will be appreciated that there is a circumferential area radially inside the strengthening layer (i.e. that area between the strengthening layer 107 and electrode 102) the majority of which is free of material of the strengthening layer. Only a small part of the membrane in this area is covered in material used to form the strengthening layer, i.e. that section of the membrane which bears the conductive track 204.

Embodiments of the invention therefore also provide a MEMS transducer having a membrane comprising a first area of first material disposed so as to form a membrane electrode and a second area of first material disposed to form a strengthening layer. The second area may substantially surround the first area and may for instance by the outer part of the membrane, but be largely separate therefore. In other words between the first and second areas there may be a third area which is mainly or substantially devoid of any first material. The first material in the second area may extend into the side walls support structure for the membrane.

As mentioned the use of the same material layer to form the strengthening layer and the membrane electrode is a particular advantage as it allows embodiments of the invention to be implemented using existing process flows with only a change to one mask layout. FIGS. 8a-8f illustrate one example of fabrication of a transducer such as shown in FIG. 7.

Figure 8A:
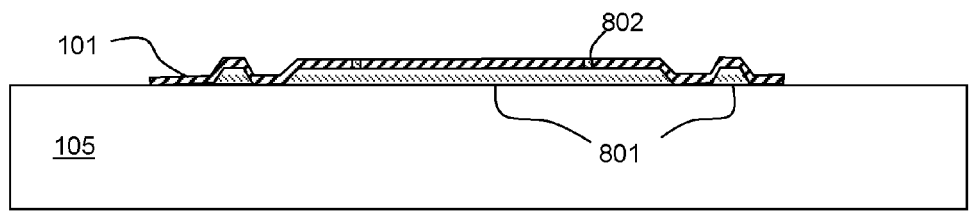
FIGS. 8a-f illustrate one suitable process for forming a MEMS transducer according to an embodiment of the invention.
Figure 8B:
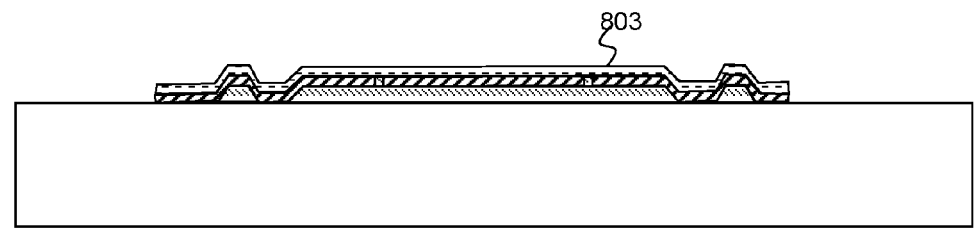
Figure 8C:
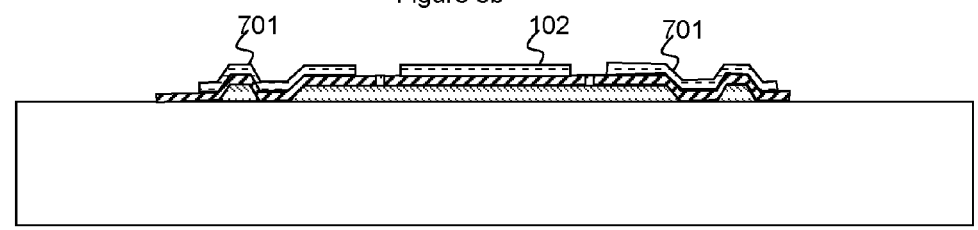

On substrate 105 first sacrificial material 801 may be deposited and shaped to define the first cavity. The sacrificial material may also be patterned to expose the substrate in certain areas which will form part of the membrane support. The sacrificial material may also be treated to ensure that the sides of the sacrificial material are sloped as will be understood by one skilled in the art. A membrane layer 101 is then deposited on the substrate so as to cover the first sacrificial material as shown in FIG. 8a. Bleed holes in the may be formed in the membrane layer within the area of the membrane at this point and filled with sacrificial material. A metal layer 803 may then be deposited over the whole of the membrane layer as shown in FIG. 8b. This metal layer may then be patterned, as shown in FIG. 8c, by using standard etching techniques, to define a membrane electrode 102 and strengthening layer 701 (as well as a conductive track 204—not shown in FIG. 8).

If required the metal layer may also be patterned so as to avoid the bleed holes 802 provided in the membrane to reduce the effects of low frequency pressure changes (by allowing the pressure in the first and second cavities to equalize over time). However in some embodiments the bleed hole may lie outside the area covered by the strengthening layer and/or electrode.

Figure 8D:
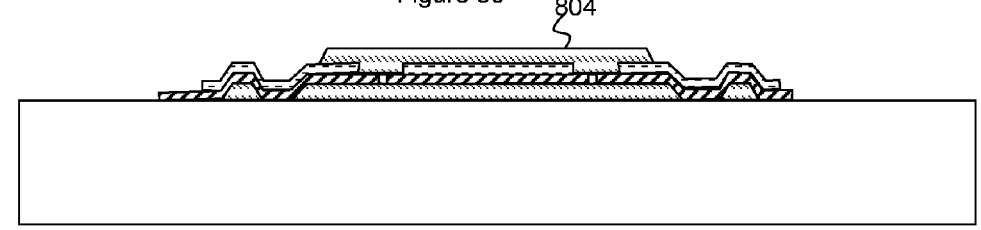
Figure 8E:
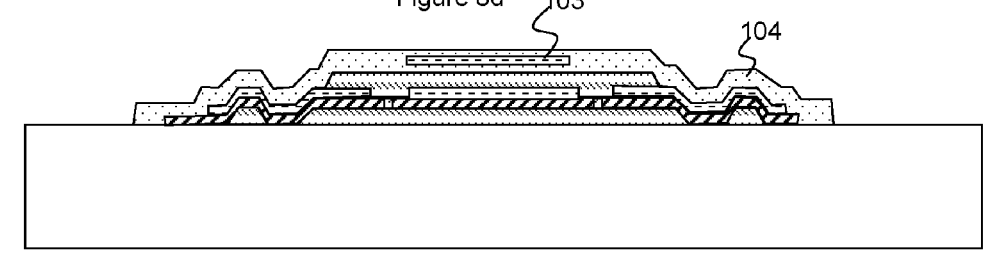

There may be some additional small channels (not shown) provided to aid removal of the sacrificial material. At least some of the these channels may be provided in the outer part of the membrane layer, in which case the metal layer 701 may be patterned to exclude metal from the location of such channels A second sacrificial layer 804 is then deposited and patterned on top of the membrane layer to define the second cavity as shown in FIG. 8d. The back plate structure 104 may then be formed by depositing a first back-plate layer, depositing and patterning a metal layer to form a back-plate electrode 103 and depositing a further back-plate layer as shown in FIG. 8e.

Figure 8F:
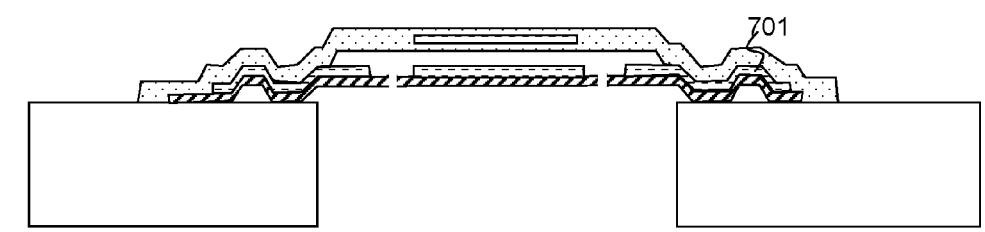

Finally, a substrate cavity may be etched through substrate 105 to the sacrificial material and the sacrificial material removed from the first cavity. Further, acoustic holes (not shown) would be etched into the back-plate layer and the sacrificial material may be removed via the acoustic holes, from the second cavity to leave a transducer structure as illustrated in FIG. 8f. This provides a transducer structure with strengthening layer 701 without requiring any additional process steps and without impacting on transducer performance.

The foregoing description has focussed mainly on embodiments including a substrate cavity having an opening in the substrate which is at least partly within the area of the membrane. As discussed aspects of the present invention may be particularly beneficial for such embodiments due to the high stress can be encountered if the membrane is deflected enough to contact the substrate cavity.

However the principles of the present invention are applicable to other arrangements as well. For instance MEMS transducers where the substrate cavity defines the first cavity, or where the spacing between the membrane and substrate is sufficient that the membrane would never contact the substrate in use may still experience high stress at the point where the membrane layer emerges from the side wall support to form the flexible membrane and may benefit from a strengthening layer which extends from the support structure at least partly onto the part of the membrane layer which forms the flexible membrane.

Also it has been proposed, for embodiments having a substrate cavity with an opening which is smaller than the first cavity under the membrane, that various structures could be used to extend over at least part of the area of the substrate cavity and provide a limit to the amount of membrane deflection in response to a large pressure differential. In other words structures may be deliberately introduced for the membrane to contact when subject to the large pressure difference but which do not present to sharp corner that the edge of a substrate cavity presents. In such arrangements the membrane will make contact with some part of such structure(s) and thus may benefit from a layer of first material extending over the membrane to the point of contact.

In some embodiments there may therefore be more than one opening in the surface of the substrate leading to one or more substrate cavities. In some embodiments there may be separate substrate cavities which collectively form an acoustic volume for the transducer. The one or more cavities will therefore have an area of opening in the surface of the substrate, i.e. area defined by the outermost parts of the perimeters of the outermost cavity openings. If the perimeter of such area of opening is within the area of the flexible membrane then it is possible, on a large deflection, that the membrane makes contact with the edge of an opening, or part of the structure between or within the substrate cavities. Thus in some embodiments the strengthening layer is disposed on the membrane layer such that the perimeter of said area of opening at least partly underlies the peripheral area of flexible membrane having said strengthening layer.

Although the various embodiments describe a MEMS capacitive microphone, the invention is also applicable to any form of MEMS transducers other than microphones, for example pressure sensors or ultrasonic transmitters/receivers.

Embodiments of the invention may be usefully implemented in a range of different material systems, however the embodiments described herein are particularly advantageous for MEMS transducers having membrane layers comprising silicon nitride.

It is noted that the embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, laptops, mobile phones, PDAs and personal computers. The invention may be used in voice controlled devices and may be implemented in home network controllers for audio or other domestic apparatus. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising:
a substrate having a cavity,
at least one membrane layer supported relative to the substrate so as to define a membrane having a flexible part;
a backplate provided on the other side of the membrane to the substrate; and
a strengthening layer disposed on said membrane layer;
wherein the strengthening layer is disposed around the majority of a peripheral area of the membrane and extends inwardly from the peripheral area beyond a perimeter of the cavity onto said flexible part of the membrane but does not extend over the whole flexible part of the membrane.

2. A MEMS transducer as claimed in claim 1 wherein the strengthening layer extends radially from a support structure supporting the membrane layer onto the flexible part of the membrane layer.

3. A MEMS transducer as claimed in claim 2 wherein the strengthening layer forms part of a side wall of the support structure.

4. A MEMS transducer as claimed in claim 1 wherein the membrane layer is supported relative to a first surface of a substrate, the substrate having at least one substrate cavity therein defining an area of opening in the first surface of the substrate, wherein the perimeter of said area of opening is at least partly within an area underlying said flexible membrane; and wherein the strengthening layer is disposed on the membrane layer such that the perimeter of said area of opening at least partly underlies the peripheral area of the membrane having said strengthening layer.

5. A MEMS transducer as claimed in claim 4 wherein the strengthening layer is disposed on the membrane layer in an area of the membrane which may make contact with the perimeter of the opening area if sufficiently deflected.

6. A MEMS transducer as claimed in claim 1 wherein the strengthening layer is disposed around 75% or more of the perimeter of the membrane.

7. A MEMS transducer as claimed in claim 1 wherein the strengthening layer is disposed such that radially inside the strengthening layer is a circumferential area of flexible membrane, the majority of which is free of the material of the strengthening layer.

8. A MEMS transducer as claimed in claim 1 wherein the strengthening layer comprises a layer of material which has at least one of: a greater elasticity; a greater plasticity and a greater ductility than the material of the membrane layer.

9. A MEMS transducer as claimed in claim 1 wherein the strengthening layer comprises a layer of material which is in greater tensile stress than the material of the membrane layer.

10. A MEMS transducer as claimed in claim 1 wherein the strengthening layer comprises a layer comprising at least one of the group of: titanium, aluminium, copper and gold or an alloy thereof.

11. A MEMS transducer as claimed in claim 1 wherein the strengthening layer comprises a plurality of layers of different materials having different materials characteristics.

12. MEMS transducer as claimed in claim 1 wherein a first strengthening layer is coupled to the membrane layer in said peripheral area and the transducer further comprises a second strengthening layer having a different geometry on the membrane layer to the first strengthening layer.

13. A MEMS transducer as claimed in claim 1 wherein the strengthening layer has a thickness of between about 30 and 100 nm inclusive.

14. A MEMS transducer as claimed in claim 1 wherein the membrane structure comprises a membrane electrode and wherein the strengthening layer is formed from the same material as the membrane electrode and wherein the material forming the membrane electrode is discrete from the strengthening layer disposed in the peripheral area of the membrane.

15. A MEMS transducer as claimed in claim 14 comprising a first area of first material disposed so as to form a membrane electrode and a second area of first material disposed to form said strengthening layer wherein said second area substantially surrounds said first area wherein between the first and second areas there is a third area which is mainly devoid of any first material.

16. A MEMS transducer as claimed in claim 1 wherein the membrane layer is supported above a substrate and the strengthening layer is disposed on the opposite side of the membrane layer to the substrate.

17. A MEMS transducer as claimed in claim 1 wherein said transducer comprises a microphone.

18. An electronic device comprising a MEMS transducer as claimed in claim 1 wherein said device is at least one of: a portable device; a battery powered device; an audio device; a computing device; a communications device; a personal media player; a mobile telephone; a games device; and a voice controlled device.

19. A method of fabricating a MEMS transducer having a membrane and a substrate having a cavity, the method comprising:
   forming a membrane layer supported relative to the substrate to form at least part of said membrane;
   providing a backplate on the other side of the membrane to the substrate; and
   forming a strengthening layer disposed on an area of said membrane layer that corresponds to a peripheral area of the membrane;
   wherein the strengthening layer extends inwardly from the peripheral area beyond a perimeter of the cavity onto said flexible part of the membrane and wherein the strengthening layer does not extend over the whole flexible part of the membrane.

* * * * *